United States Patent [19]

Kawano

[11] Patent Number: 4,979,194
[45] Date of Patent: Dec. 18, 1990

[54] CIRCUIT FOR GENERATING PULSE HAVING PREDETERMINED TIME PERIOD WIDTH BASED ON TRIGGER SIGNAL

[75] Inventor: Mitsumo Kawano, Kumagaya, Japan

[73] Assignee: Kabushiki Kaisha Toshiba, Kawasaki, Japan

[21] Appl. No.: 410,518

[22] Filed: Sep. 21, 1989

[30] Foreign Application Priority Data

Sep. 29, 1988 [JP] Japan ................... 63-242221

[51] Int. Cl.$^5$ .................. H03K 21/02; H03K 21/10
[52] U.S. Cl. .............................. 377/55; 328/58; 328/61; 328/129.1; 307/265; 377/20
[58] Field of Search .............. 307/265; 328/58, 61, 328/129.1; 377/55, 20, 56

[56] References Cited

U.S. PATENT DOCUMENTS

| | | | |
|---|---|---|---|
| 3,868,845 | 3/1975 | Shimizu | 377/20 |
| 3,968,445 | 7/1976 | Sherman | 328/58 |
| 4,052,676 | 10/1977 | Crittenden | 377/20 |
| 4,396,909 | 8/1983 | Suzuki | 307/265 |
| 4,692,710 | 9/1987 | Shvartsman | 307/265 |
| 4,870,664 | 9/1989 | Hayashi | 328/129.1 |

FOREIGN PATENT DOCUMENTS

2608413 9/1977 Fed. Rep. of Germany .

OTHER PUBLICATIONS

"High Speed Data Format Converter Circuit", IBM Technical Disclosure Bulletin, vol. 20, No. 11, Apr. 1987, pp. 5036-5039.
"Digitally Controlled Monostable", Applied Ideas, Electronic Engineering, No. 743, Nov. 1988, p. 26.
Patent Abstracts of Japan, vol. 6, No. 32, Feb. 26, 1982.

Primary Examiner—John S. Heyman
Attorney, Agent, or Firm—Cushman, Darby & Cushman

[57] ABSTRACT

A first input section inputs a first signal serving as a trigger. A second input section inputs second and third signals having phases opposite to each other to set a time period width. A first data hold section obtains a first hold output in response to the first and second signals respectively output from the first and second input sections. A second data hold section obtains a second hold output in response to the first and third signals respectively output from the first and second input sections. A determination section determines whether the first hold output from the first data hold section or the second hold output from the second data hold section is output first. A selection section selects the second or third signal from the second input section in accordance with a determination result from the determination section. A counter counts the second or third signal selected by the selection section to set a time period width of a pulse signal to be output, and generates the pulse signal to be output at a predetermined timing in response to the first and second hold outputs respectively output from the first and second data hold sections.

15 Claims, 4 Drawing Sheets

CIRCUIT FOR GENERATING PULSE HAVING PREDETERMINED TIME PERIOD WIDTH BASED ON TRIGGER SIGNAL

BACKGROUND OF THE INVENTION

1. Field of the Invention

The present invention generally relates to a pulse generating circuit and, more particularly, to a digital pulse generating circuit for generating a pulse signal having a predetermined time period width based on a trigger signal.

2. Description of the Related Art

In a video system, it is often required to generate a pulse signal having a predetermined time period width in response to a sync signal serving as a trigger. For example, it is often required to generate a pulse associated with automatic gain control (AGC) in the video system, i.e., a signal used to discriminate a pulse width of a horizontal sync signal.

In such a conventional video system, when a pulse signal having a predetermined time period width is generated in response to a sync signal serving as a trigger, a digital pulse generating circuit is used to count a predetermined number of clocks having a predetermined period and output a pulse. In such a pulse generating circuit, when a time period width of a pulse signal to be generated is set to be about twice that of the clock, an analog doubler is required, as shown in FIG. 6.

More specifically, a clock SC used as a system clock is converted into a clock having a frequency twice that of the clock SC by a doubler 20. An output from the doubler 20 is used as a clock of a counter 21, and the counter 21 receives a sync signal (SYNC) as a trigger input. Therefore, an output pulse having a predetermined time period width which is about twice that of the system clock SC can be obtained from the counter 21.

The doubler is often constituted by a pure analog circuit or a semi-analog digital circuit utilizing delay of a gate. In such a doubler, however, the number of parts is increased or a stable operation cannot be realized.

Thus, since the analog doubler used for the pulse generating circuit has the above drawbacks, in the entire conventional pulse generating circuit for generating a pulse signal having a predetermined time period width by counting a clock having a predetermined period, the number of parts is increased or a stable operation cannot be realized.

SUMMARY OF THE INVENTION

It is, therefore, an object of the present invention to provide a new and improved pulse generating circuit which has a simple digital circuit arrangement to stably and accurately generate a pulse signal having a predetermined time period width.

According to one aspect of the present invention, there is provided a pulse generating circuit comprising:
first input means for inputting a first signal serving as a trigger;
second input means for inputting second and third signals having phases opposite to each other to set a time period width;
first data holding means for obtaining a first hold output in response to the first and second signals respectively output from the first and second input means;
second data holding means for obtaining a second hold output in response to the first and third signals respectively output from the first and second input means;
determination means for determining whether the first hold output from the first data holding means or the second hold output from the second data holding means is output first;
selection means for selecting the second or third signal from the second inputting means in accordance with a determination result from the determination means; and
counter means for counting the second or third signal selected by the selection means to set a time period width of a pulse signal to be output, and for generating the pulse signal to be output at a predetermined timing in response to the first and second hold outputs respectively output from the first and second data holding means.

In order to solve the above problems, there is provided a pulse generating circuit according to another aspect of the present invention comprising:
first data holding means for receiving a first signal as data to obtain a first hold output in response to a second signal supplied as a clock;
second data holding means for receiving the first signal as data to obtain a second hold output in response to a third signal having a phase opposite to that of the second signal supplied as a clock;
determination means for determining whether the first hold output from the first data holding means or the second hold output from the second data holding means rises first after the first signal input to the first and second data holding means as data rises;
selection means for selecting the second or third signal of one of the first and second hold outputs which rises first to guide the signal as a clock used to set a time period width of a pulse signal; and
counter means for counting the clock selected by the selection means to set a time period width of a pulse signal, and for generating a pulse signal having a predetermined time period width at a predetermined timing in accordance with data output from the first and second data holding means.

With the above arrangement, according to the present invention, there is provided a pulse generating circuit which has a digital circuit arrangement to stably and accurately generate a pulse signal having a predetermined time period width.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will be described hereinafter with reference to the accompanying drawings.

Figure 1:
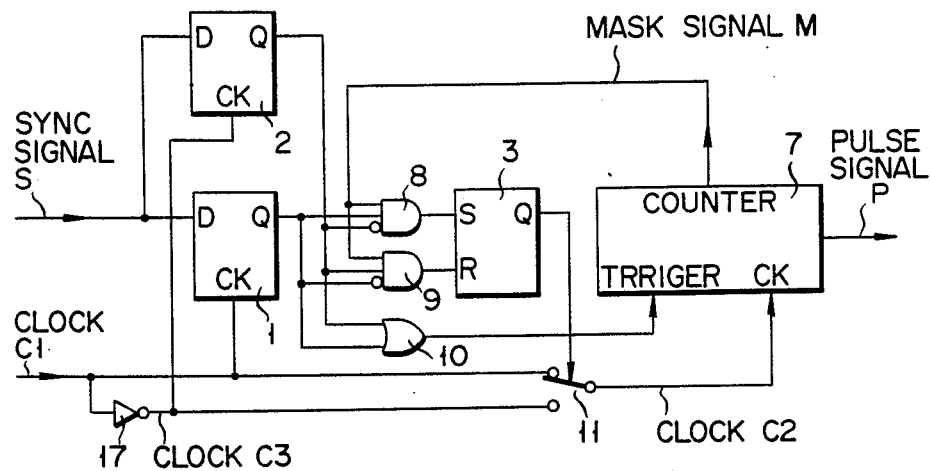
FIG. 1 is a circuit diagram showing an arrangement of a pulse generating circuit according to a first embodiment of the present invention.

FIG. 1 is a circuit diagram showing an arrangement of a pulse generating circuit according to a first embodiment of the present invention. Referring to FIG. 1, the circuit of this embodiment includes D flip-flops be referred to as DFFs hereinafter) 1 and 2 serving as data holding means, an SR flip-flop (to be referred to as an SRFF hereinafter) 3 and AND gates 8 and 9 for constituting a determining means, an OR gate 10, a switch 11 serving as a selecting means, a counter 7 serving as a counter means, and an inverter 17.

Input terminals D of the DFFs 1 and 2 receive a sync signal S serving as a trigger for generation of a pulse signal. A clock C1 having a predetermined period is supplied to a clock terminal CK of the DFF 1, and a clock C3 having a phase opposite to that of the clock C1 is supplied to a clock terminal CK of the DFF 2 through the inverter 17. When the sync signal S input to the DFFs 1 and 2 is set at high level (to be referred to as "H" hereinafter) and the clock C1 rises, an output from the DFF 1 goes to "H" prior to rising of an output from the DFF 2. An output terminal Q of the DFF 1 is connected to the second input terminal of the AND gate 8, the negative logic input terminal of the AND gate 9, and the OR gate 10. An output terminal Q of the DFF 2 is connected to the negative logic input terminal of the AND gate 8, the second input terminal of the AND gate 9, and the OR gate 10. In addition, the first input terminals of the AND gates 8 and 9 receive a mask signal M from the counter 7 (to be described later).

The output terminals of the AND gates 8 and 9 are connected to set and reset terminals S and R of the SRFF 3, respectively. The output terminal of the OR gate 10 is connected to the trigger input terminal of the counter 7.

A signal from an output terminal Q of the SRFF 3 is used to control the switch 11. The switch 11 selects one of the clocks C1 and C3, and the selected clock is supplied to a clock terminal CK of the counter 7.

When an output from the DFF 1 is set at "H", a signal to be input to the set terminal S of the SRFF 3 goes to "H", and the SRFF 3 is set. Therefore, an output from the SRFF 3 goes to "H", and the clock Cl is used as the clock C2 to be supplied to the clock terminal CK of the counter 7.

When the sync signal S input to the input terminals D of the DFFs 1 and 2 is set at "H" and the clock C1 falls, an output from the DFF 2 goes to "H" prior to rising of an output from the DFF 1. When the output from the DFF 2 is set at "H", a signal to be input to the reset terminal R of the SRFF 3 goes to "H", and hence the SRFF 3 is reset. Therefore, an output from the SRFF 3 goes to low level (to be referred to as "L" hereinafter), and the switch 11 is switched. Therefore, the clock C3 is used as the clock C2 to be supplied to the clock terminal CK of the counter 7.

The OR gate 10 is inserted between the output terminals Q of the DFFs 1 and 2 and the trigger terminal of the counter 7. Of the outputs from the DFFs 1 and 2, the output which goes to "H" first in response to the sync signal S is used as a trigger to generate a pulse signal. More specifically, after the output goes to "H", a counting operation of the clock C2 is started. Until the pulse signal having a predetermined time period width is output from the counter 7, outputs from the AND gates 8 and 9 are always kept at "L" in response to a mask signal M, and hence inputs to the set and reset terminals S and R of the SRFF 3 from the DFFs 1 and 2 are masked.

With such a circuit arrangement, a time period until the clock is supplied to the counter 7 from a leading edge of the sync signal S is 0 to 0.5 clocks. A time period of the conventional circuit until the clock is supplied to the counter from a leading edge of the sync signal was 0 to 1.0 clock. With the above arrangement, a time period about twice that of the conventional circuit can be obtained.

Figure 2:
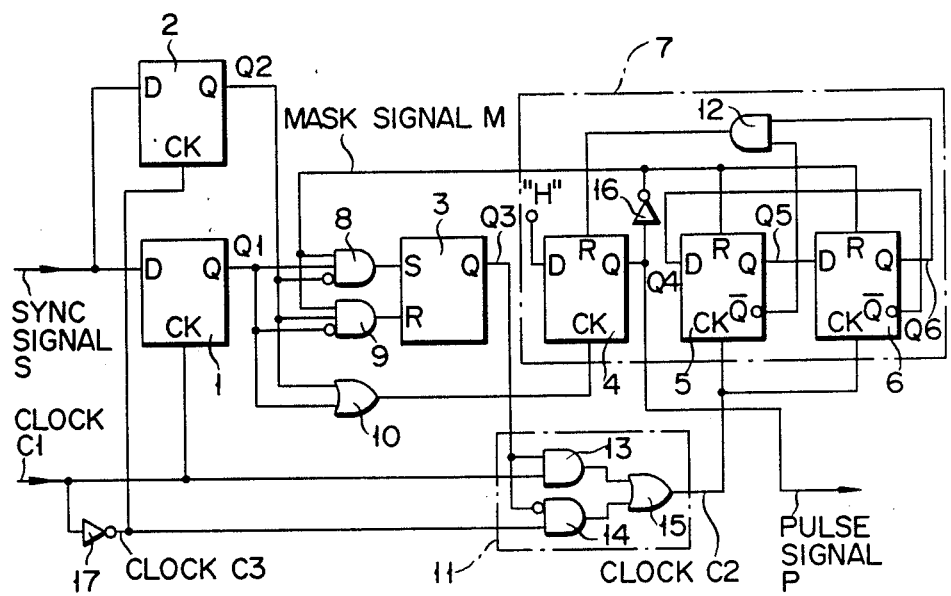
FIG. 2 is a circuit diagram showing an arrangement of a circuit according to a second embodiment obtained by embodying the circuit of the first embodiment shown in FIG. 1.
Figure 3:
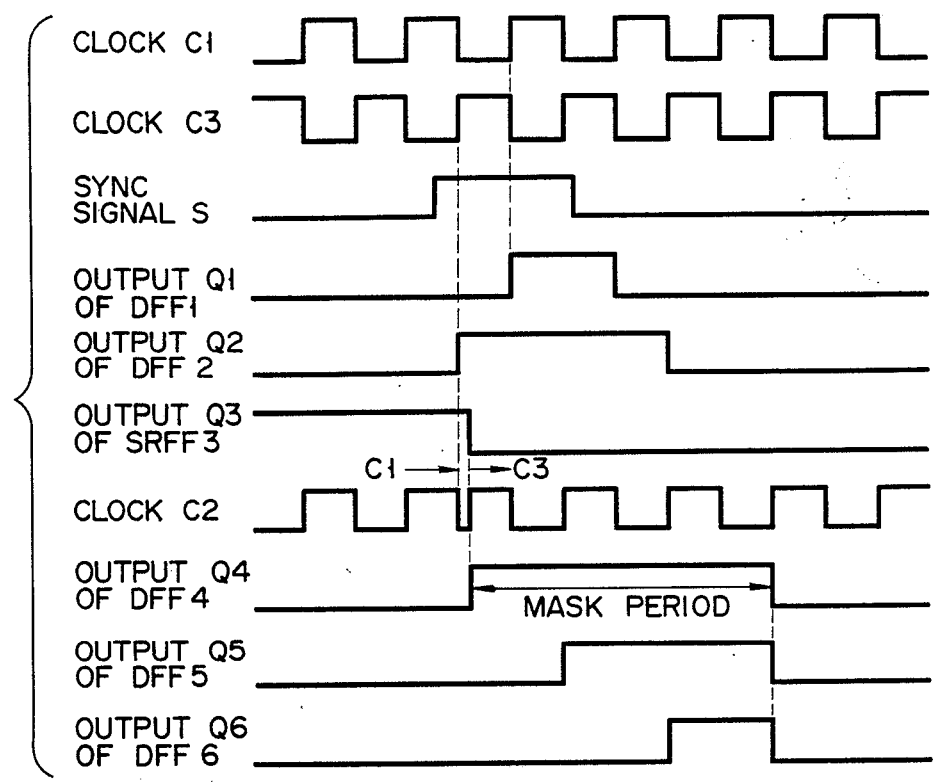
FIG. 3 is a timing chart of an operation of the circuit of the embodiment shown in FIG. 2.
Figure 6:
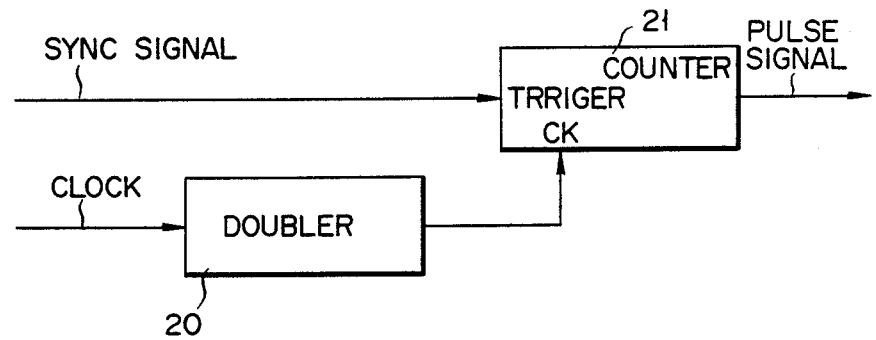
FIG. 6 is a block diagram showing a schematic arrangement of a conventional pulse generating circuit.

FIG. 2 is a circuit diagram showing an arrangement of a second embodiment obtained by further embodying the circuit according to the first embodiment shown in FIG. 1. FIG. 3 is a timing chart of an operation of the circuit according to the second embodiment shown in FIG. 2. The counter 7 in FIG. 1 corresponds to DFFs 4, 5, and 6, an AND gate 12, and an inverter 16, as shown in FIG. 2. The switch 11 in FIG. 1 corresponds to AND gates 13 and 14 and an OR gate 15, as shown in FIG. 2.

In the operation timing chart shown in FIG. 3, when a sync signal S goes to "H", at a trailing edge of a clock Cl, i.e., at a leading edge of a clock C3, an output Q2 from a DFF 2 goes to "H" prior to rising of an output Q1 from a DFF 1, and hence an SRFF 3 is reset. Therefore, an output Q3 from the SRFF 3 goes to "L", and the AND gates 13 and 14 and the OR gate 15 in the switch 11 supply the clock C3 to clock terminals CK of the DFFs 5 and 6 in the counter 7.

An input to the DFF 4 in the counter 7 is always set at "H". A signal obtained by causing an OR gate 10 to perform a logical operation of the outputs Q1 and Q2 respectively output from the DFFs 1 and 2 is supplied to a clock terminal CK of the DFF 4. More specifically, when the output Q2 from the DFF 2 goes to "H", an output Q4 from the DFF 4 also goes to "H". The output Q4 is supplied to reset terminals R of the DFFs 5 and 6 through the inverter 16, so that a reset state of the DFFs 5 and 6 is released. In addition, the output Q4 is supplied to AND gates 8 and 9 through the inverter 16, so that inputs to reset and set terminals R and S of the SRFF 3 from the DFFs 1 and 2 are masked.

As described above, when the output Q3 from the SRFF 3 goes to "L", the switch 11 is switched. Therefore, the clock C3 is used as the clock C2 to be supplied to the clock terminals CK of the DFFs 5 and 6 in the counter 7, and the clock C3 is counted by the counter 7. When an output Q5 from the DFF 5 goes to "L" and an output Q6 from the DFF 6 goes to "H", an output from the AND gate 12 goes to "H". Therefore, an output from the AND gate 12 is supplied to the reset terminal R of the DFF 4, and the DFF 4 is reset. In addition, the DFFs 5 and 6 are reset, and masking of inputs to the reset and set terminals R and S of the SRFF 3 is released.

In the pulse generating circuit of this embodiment, the output Q4 from the DFF 4 serves as a pulse signal to be generated. When a delay of the gate is disregarded, at leading and trailing edges of the pulse signal, the signal has a variation within the range of 0 to 0.5 clocks. A time period width about twice that of the pulse signal of the conventional circuit which has a variation within the range of 0 to 1.0 clock can be obtained. Note that, in this embodiment, a duty ratio of the clock used to set a time period width of the pulse signal must be about 1:1. Utilizing the leading and trailing edges of the clock, a time period width of the pulse signal to be generated can be set to be equal to the time period width of a clock having a period twice that of the clock of this embodiment.

A third embodiment of the present invention will be described below with reference to FIGS. 4 and 5. Note that the same parts in FIG. 4 are denoted by the same reference numerals or the same reference numerals with primes as in FIGS. 1 and 2, and a description thereof will be omitted.

Figure 4:
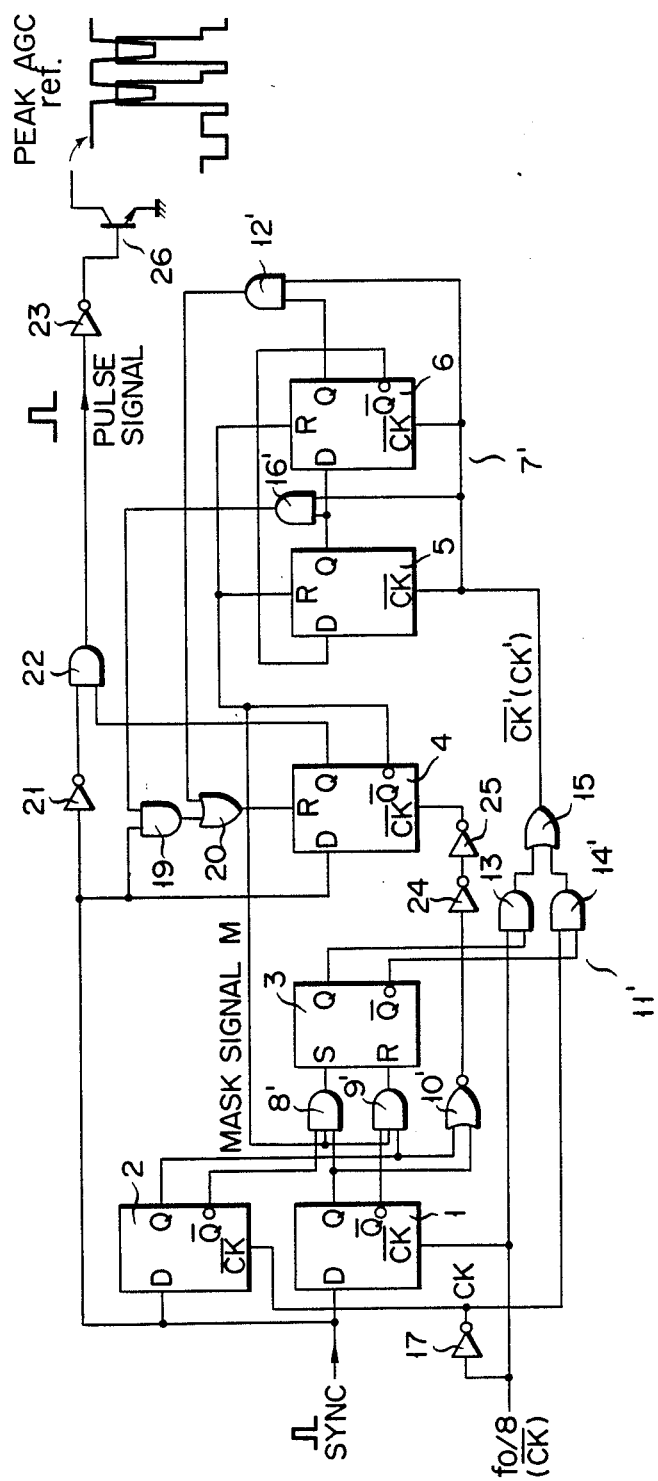
FIG. 4 is a circuit diagram showing an arrangement of a pulse generating circuit according to a third embodiment of the present invention.
Figure 5:
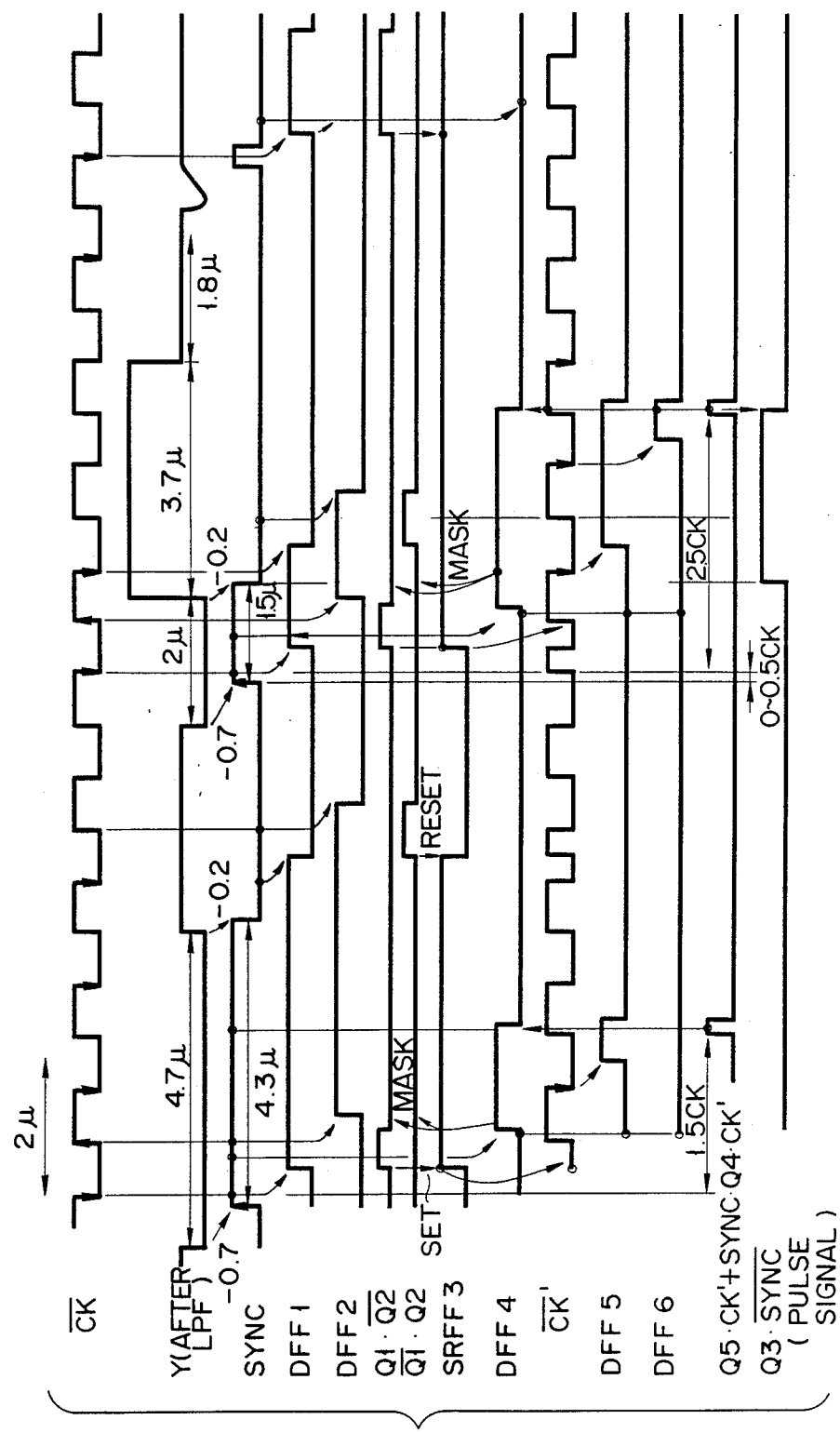
FIG. 5 is a timing chart of an operation of the circuit of the embodiment shown in FIG. 4.

FIG. 4 is a circuit diagram and FIG. 5 is a timing chart, when the third embodiment is applied to generation of a new AGC standard pulse used in a video system.

In this case, a sync signal is used as a trigger. The sync signal is delayed by 0.7 μs at its leading edge, and delayed by 0.2 μs at its trailing edge when the sync signal is sync-separated from a video signal (luminance component Y after a low-pass filter). Therefore, the pulse width of 4.7 μs of the normal sync signal is decreased to be about 4.2 μs, and the pulse width of 2 μs of a pseudo sync signal is decreased to be 1.5 μs. Such a sync signal is subjected to waveform processing to finally obtain a pulse. A ⅛ frequency-divided output (fo/8) from a VCO (voltage controlled oscillator) (not shown) for generating a color subcarrier (fo) is used as a clock to obtain the pulse. Since a period of the clock (fo/8) is as relatively long as 1.6 μs, both edges of the clock are utilized in this embodiment.

In FIG. 4, both DFFs 1 and 2 receive a sync signal (SYNC) as a data input (D). A negative phase clock ($\overline{CK}$) of the clock fo/8 is input to a clock input terminal ($\overline{CK}$) of the DFF 1, and the clock (CK) is input to a clock input terminal ($\overline{CK}$) of the DFF 2 as a positive clock ($\overline{CK}$) through an inverter 17. This embodiment will be described hereinafter with reference to the timing chart in FIG. 5. If the sync signal (SYNC) is input to the DFF 1 first (Q1=1), an SRFF 3 is set through AND gates 8' and 9' Therefore, a negative phase clock ($\overline{CK}'$) is input to DFFs 5 and 6 through a switch 11'. On the contrary, if the SYNC is input to the DFF 2 first (Q2=1), the SRFF 3 is reset. Therefore, a positive phase clock (CK') is input to the DFFs 5 and 6. When the SYNC is input and hence an output Q from one of the DFFs 1 and 2 goes to "1", the negative phase clock ($\overline{CK}'$) is input to a clock input terminal ($\overline{CK}$) of a DFF 4 through a NOR gate 10' and inverters 24 and 25, and the SYNC is input to the DFF 4. At this time, if the SYNC is disabled ("0"), the signal is, e.g., noise having a pulse width of 0.7 μs or less. Therefore, the DFF 4 is kept in a reset state, and a reset state of the DFFs 5 and 6 is maintained.

When the DFF 4 is set in response to the SYNC, set and reset inputs to the SRFF 3 are masked, and a counter 7' constituted by the DFFs 5 and 6 starts a counting operation. If the counter 7' counts the clock CK' up to 1.5 CK' and the SYNC is still present ("1") at this time (a normal SYNC), the DFF 4 is reset and the DFFs 5 and 6 are also reset. When the counter 7' counts 1.5 CK' (2.4 μs) and the SYNC has been already disabled (pseudo SYNC), a counting operation is further continued. When the counter 7' counts 2.5 CK', the DFF 4 is reset through AND gates 12', 16', and 19 and an OR gate 20, and the counter itself is reset. Finally, an AND gate 22 calculates a logical product of the sync signal ($\overline{SYNC}$) through an inverter 21 and the output Q from the DFF 4, thus obtaining a pulse. The pulse is supplied to the base of a transistor 26 in a color block (not shown) through an inverter 23 as a reference signal of a peak ABC having a waveform presented from the collector of the transistor 26, shown in FIG. 4.

As described above, since it takes 0 to 0.5 CK' (0.8 /μs) from a leading edge of the sync signal after separation to a leading edge of the DFFs 1 and 2, the width of the sync signal (SYNC) which is sufficient to output the pulse falls within the range from about 0.7 μs to the range of 2.4 to 3.2 μs. The pulse falls after 4 to 4.8 μs elapse. The width of the pulse when the width of the SYNC is 1.5 μs falls within the range of 2.5 to 3.3 μ.

Although the embodiments of the present invention have been described above, the present invention is not limited to the above embodiments, and various changes and modifications may be made within the spirit and scope of the invention.

As has been described above, according to the present invention, there is provided a pulse generating circuit for stably and accurately generating a pulse signal having a predetermined time period width.

What is claimed is:

1. A pulse generating circuit comprising:
   first input means for inputting a first signal serving as a trigger;
   second input means for inputting second and third signals having phases opposite to each other to set a time period width;
   first data holding means for obtaining a first hold output in response to the first and second signals respectively output from said first and second input means;
   second data holding means for obtaining a second hold output in response to the first and third signals respectively output from said first and second input means;
   determination means for determining whether the first hold output from said first data holding means or the second hold output from said second data holding means is output first;
   selection means for selecting the second or third signal from said second input means in accordance with a determination result from said determination means; and
   counter means for counting the second or third signal selected by said selection means to set a time period width of a pulse signal to be output, and for generating the pulse signal to be output at a predetermined timing in response to the first and second hold outputs respectively output from said first and second data holding means.

2. A circuit according to claim 1, wherein said first and second data holding means comprise first and second D flip-flops, respectively.

3. A circuit according to claim 2, wherein said determination means comprises means for masking outputs from said first and second D flip-flops in response to an output from said counter means.

4. A circuit according to claim 3, wherein said masking means comprises first and second AND gates.

5. A circuit according to claim 4, wherein said determination means comprises an SR flip-flop for receiving outputs from said first and second AND gates.

6. A circuit according to claim 5, wherein said selection means comprises third and fourth AND gates for calculating a logical product of the second and third signals from said second input means and an output from said SR flip-flop, and an OR gate for calculating a logical sum of outputs from said third and fourth AND gates.

7. A circuit according to claim 6, wherein said counter means comprises cascade-connected third and fourth D flip-flops for receiving an output from said OR gate as a clock input, and a fifth D flip-flop for generating the pulse signal to be output in response to outputs from said third and fourth D flip-flops and outputs from said first and second D flip-flops.

8. A pulse generating circuit comprising:
first input means for inputting a first signal serving as a trigger;
second input means for inputting second and third signals having phases opposite to each other to set a time period width;
first data holding means for obtaining a first hold output in response to the first and second signals respectively output from said first and second input means;
second data holding means for obtaining a second hold output in response to the first and third signals respectively output from said first and second input means;
determination means for determining whether the first hold output from said first data holding means or the second hold output from said second data holding means is output first;
selection means for selecting the second or third signal from said second input means in accordance with a determination result from said determination means;
counter means for counting the second or third signal selected by said selection means to set a time period width of a pulse signal to be output, and for generating the pulse signal to be output at a predetermined timing in response to the first and second hold outputs respectively output from said first and second data holding means; and
outputting means for calculating a logical product of the pulse signal to be output from said counter means and the first signal from said first input means.

9. A circuit according to claim 8, wherein said first and second data holding means comprise first and second D flip-flops, respectively.

10. A circuit according to claim 9, wherein said determination means comprises means for masking outputs from said first and second D flip-flops in response to an output from said counter means.

11. A circuit according to claim 10, wherein said masking means comprises first and second AND gates.

12. A circuit according to claim 11, wherein said determination means comprises an SR flip-flop for receiving outputs from said first and second AND gates.

13. A circuit according to claim 12, wherein said selection means comprises third and fourth AND gates for calculating a logical product of the second and third signals from said second inputting means and an output from said SR flip-flop, and an OR gate for calculating a logical sum of outputs from said third and fourth AND gates.

14. A circuit according to claim 13, wherein said counter means comprises cascade-connected third and fourth D flip-flops for receiving an output from said OR gate as a clock input, and a fifth D flip-flop for generating the pulse signal to be output in response to outputs from said third and fourth D flip-flops, outputs from said first and second D flip-flops, and the first signal from said first input means.

15. A pulse generating circuit for generating a pulse signal having a predetermined time period width in response to a first signal used to trigger generation of the pulse signal and a second signal used to set a time period width of the pulse signal, comprising:
first data holding means for receiving the first signal as data to obtain a first hold output in response to the second signal supplied as a clock;
second data holding means for receiving the first signal as data to obtain a second hold output in response to a third signal having a phase opposite to that of the second signal supplied as a clock;
determination means for determining whether the first hold output from said first data holding means or the second hold output from said second data holding means rises first after the first signal input to said first and second data holding means as data rises;
selection means for selecting the second or third signal of one of the first and second hold outputs which rises first to guide the signal as a clock used to set a time period width of a pulse signal; and
counter means for counting the clock selected by said selection means to set a time period width of a pulse signal, and for generating a pulse signal having a predetermined time period width at a predetermined timing in accordance with data output from said first and second data holding means.

* * * * *